(12) United States Patent
Lan

(10) Patent No.: US 8,918,744 B2
(45) Date of Patent: Dec. 23, 2014

(54) SUBSTRATE-TOPOGRAPHY-AWARE LITHOGRAPHY MODELING

(71) Applicant: Song Lan, Cupertino, CA (US)

(72) Inventor: Song Lan, Cupertino, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 13/761,075

(22) Filed: Feb. 6, 2013

(65) Prior Publication Data

US 2013/0205263 A1 Aug. 8, 2013

Related U.S. Application Data

(60) Provisional application No. 61/595,910, filed on Feb. 7, 2012.

(51) Int. Cl.
G06F 17/50 (2006.01)
G03F 7/20 (2006.01)

(52) U.S. Cl.
CPC ............ *G03F 17/5009* (2013.01); *G03F 7/705* (2013.01); *G03F 7/70625* (2013.01); *G03F 7/70666* (2013.01)
USPC ................... 716/54; 716/50; 716/51; 716/52; 716/53; 716/55; 430/5; 430/30

(58) Field of Classification Search
USPC .................. 716/50–55; 430/5, 30; 703/13–14
See application file for complete search history.

(56) References Cited

U.S. PATENT DOCUMENTS

| 6,046,792 | A | 4/2000 | Van Der Werf et al. | |
|---|---|---|---|---|
| 6,171,731 | B1 * | 1/2001 | Medvedeva et al. | 430/5 |
| 7,587,704 | B2 | 9/2009 | Ye et al. | |
| 7,649,615 | B2 * | 1/2010 | Case et al. | 355/77 |
| 8,200,468 | B2 | 6/2012 | Ye et al. | |
| 8,404,403 | B2 * | 3/2013 | Ogadhoh et al. | 430/5 |

(Continued)

FOREIGN PATENT DOCUMENTS

| CN | 1661773 | 8/2005 |
|---|---|---|
| CN | 1956064 | 5/2007 |

(Continued)

OTHER PUBLICATIONS

Andreas Erdmann et al., "Rigorous Simulation of Exposure over Non-Planar Wafers," Proc. of Spie, vol. 5040, pp. 101-111 (2003).

(Continued)

*Primary Examiner* — Nghia Doan
(74) *Attorney, Agent, or Firm* — Pillsbury Winthrop Shaw Pittman LLP

(57) ABSTRACT

Described herein is a method for simulating an image formed within a resist layer on a substrate resulting from an incident radiation, the substrate having a first feature and a second feature underlying the resist layer, the method comprising: simulating a first partial image using interaction of the incident radiation and the first feature without using interaction of the incident radiation and the second feature; simulating a second partial image using the interaction of the incident radiation and of the second feature without using the interaction of the incident radiation and the first feature; computing the image formed within the resist layer from the first partial image, and the second partial image; wherein the interaction of the incident radiation and the first feature is different from the interaction of the incident radiation and the second feature.

23 Claims, 8 Drawing Sheets

(56) References Cited

U.S. PATENT DOCUMENTS

| | | | |
|---|---|---|---|
| 2008/0076045 A1* | 3/2008 | Willis et al. | 430/30 |
| 2012/0124529 A1 | 5/2012 | Feng et al. | |
| 2013/0042211 A1 | 2/2013 | Liu | |

FOREIGN PATENT DOCUMENTS

| | | |
|---|---|---|
| CN | 101073084 | 11/2007 |
| CN | 100353140 C | 12/2007 |
| CN | 101496140 | 7/2009 |
| CN | 102007454 | 4/2011 |
| CN | 102135725 | 7/2011 |
| CN | 102169295 | 8/2011 |
| JP | H06-342746 | 12/1994 |
| WO | 2011/162890 | 12/2011 |

OTHER PUBLICATIONS

Hans-Jürgen Stock et al., "Virtual Fab Flow for Wafer Topography Aware OPC," Proc. of SPIE, vol. 7640, No. 76401U, pp. 76401U-1-76401U-12 (2010).

Hua Song et al., "Wafer Topography Proximity Effect Modeling and Correction for Implant Layer Patterning," Proc. of SPIE, vol. 7488, No. 74883F, pp. 74883F-1-74883F-9 (2009).

Nikolay Voznesenskiy et al., "Large Scale Model of Wafer Topography Effects," Proc. of SPIE, vol. 7973, No. 79732G, pp. 79732G-1-79732G-8 (2011).

* cited by examiner

SUBSTRATE-TOPOGRAPHY-AWARE LITHOGRAPHY MODELING

CROSS-REFERENCE TO RELATED APPLICATIONS

This application claims priority to U.S. Provisional Application No. 61/595,910 filed Feb. 7, 2012, which is incorporated herein by reference in its entirety.

FIELD OF INVENTION

This invention relates generally to lithography processes and relates more particularly to a method for modeling a lithography process which is aware of the topography of the substrate.

BACKGROUND

Lithographic projection apparatuses can be used, for example, in the manufacture of integrated circuits (ICs). In such a case, the mask may contain a circuit pattern corresponding to an individual layer of the IC, and this pattern can be imaged onto a target portion (e.g., comprising one or more dies) on a substrate (e.g., a silicon wafer) that has been coated with a layer of radiation-sensitive material (resist). In general, a single wafer will contain a whole network of adjacent target portions that are successively irradiated via the projection system of a lithographic projection apparatus, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step and scan apparatus, each target portion is irradiated by progressively scanning the mask pattern under the projection beam in a given reference direction (the "scanning" direction) while synchronously scanning the substrate table parallel or anti parallel to this direction. Since, in general, the projection system will have a magnification factor M (generally <1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation sensitive material (resist). Prior to this imaging step, the substrate may undergo various procedures, such as priming, resist coating and a soft bake. After exposure, the substrate may be subjected to other procedures, such as a post exposure bake (PEB), development, a hard bake and measurement/inspection of the imaged features. This array of procedures is used as a basis to pattern an individual layer of a device, e.g., an IC. Such a patterned layer may then undergo various processes such as etching, ion implantation (doping), metallization, oxidation, chemo mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "lens"; however, this term should be broadly interpreted as encompassing various types of projection systems, including refractive optics, reflective optics, and catadioptric systems, for example. The projection system may also include components operating according to any of these design types for directing, shaping or controlling the projection beam of radiation, and such components may also be referred to below, collectively or singularly, as a "lens". Further, the lithographic projection apparatus may be of a type having two or more substrate tables (and/or two or more mask tables). In such "multiple stage" devices the additional tables may be used in parallel, or preparatory steps may be carried out on one or more tables while one or more other tables are being used for exposures.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the wafer (via the mask).

As noted, lithography is a central step in the manufacturing of semiconductor integrated circuits, where patterns formed on substrates define the functional elements of semiconductor devices, such as microprocessors, memory chips etc. Similar lithographic techniques are also used in the formation of flat panel displays, micro-electro mechanical systems (MEMS) and other devices.

As semiconductor manufacturing processes continue to advance, the dimensions of circuit elements have continually been reduced while the amount of functional elements, such as transistors, per device has been steadily increasing over decades, following a trend commonly referred to as "Moore's law". At the current state of technology, critical layers of leading-edge devices are manufactured using optical lithographic projection systems known as scanners that project a mask image onto a substrate using illumination from a deep-ultraviolet laser light source, creating individual circuit features having dimensions well below 100 nm, i.e. less than half the wavelength of the projection light.

This process in which features with dimensions smaller than the classical resolution limit of an optical projection system are printed, is commonly known as low-k1 lithography, according to the resolution formula $CD=k_1 \times \lambda/NA$, where $\lambda$ is the wavelength of radiation employed (currently in most cases 248 nm or 193 nm), NA is the numerical aperture of the projection optics, CD is the "critical dimension"—generally the smallest feature size printed—and $k_1$ is an empirical resolution factor. In general, the smaller $k_1$, the more difficult it becomes to reproduce a pattern on the wafer that resembles the shape and dimensions planned by a circuit designer in order to achieve particular electrical functionality and performance. To overcome these difficulties, sophisticated fine-tuning steps are applied to the projection system as well as to the mask design. These include, for example, but not limited to, optimization of NA and optical coherence settings, customized illumination schemes, use of phase shifting masks, optical proximity correction in the mask layout, or other methods generally defined as "resolution enhancement techniques" (RET).

As one important example of RET, optical proximity correction (OPC), addresses the fact that the final size and placement of a printed feature on the wafer will not simply be a function of the size and placement of the corresponding feature on the mask. It is noted that the terms "mask" and "reticle" are utilized interchangeably herein. For the small feature sizes and high feature densities present on typical circuit designs, the position of a particular edge of a given feature will be influenced to a certain extent by the presence or absence of other adjacent features. These proximity effects arise from minute amounts of light coupled from one feature to another. Similarly, proximity effects may arise from diffusion and other chemical effects during post-exposure bake (PEB), resist development, and etching that generally follow lithographic exposure.

In order to ensure that the features are generated on a semiconductor substrate in accordance with the requirements of the given target circuit design, proximity effects need to be predicted utilizing sophisticated numerical models, and corrections or pre-distortions need to be applied to the design of the mask before successful manufacturing of high-end devices becomes possible. In a typical high-end design almost every feature edge requires some modification in order to achieve printed patterns that come sufficiently close to the target design. These modifications may include shifting or biasing of edge positions or line widths as well as application of "assist" features that are not intended to print themselves, but will affect the properties of an associated primary feature. In the semiconductor industry, microlithography (or simply lithography) is the process of printing circuit patterns on a semiconductor wafer (for example, a silicon or GaAs wafer). Currently, optical lithography is the predominant technology used in volume manufacturing of semiconductor devices and other devices such as flat-panel displays. Such lithography employs light in the visible to the deep ultraviolet spectral range to expose photosensitive resist on a substrate. In the future, extreme ultraviolet (EUV) and soft x-rays may be employed. Following exposure, the resist is developed to yield a resist image.

FIG. 1 illustrates an exemplary lithographic projection system 10. The major components are a light source 12, which may be, for example, a deep-ultraviolet excimer laser source, or a source of other wavelengths, including EUV wavelength, illumination optics, which define the partial coherence, and which may include specific source shaping optics 14, 16a and 16b; a mask or reticle 18; and projection optics 16c that produce an image of the reticle pattern onto the wafer plane 21. An adjustable filter or aperture 20 at the pupil plane may restrict the range of beam angles that impinge on the wafer plane 22, where the largest possible angle defines the numerical aperture of the projection optics $NA=\sin(\theta_{max})$.

An exemplary flow chart for simulating lithography in a lithographic projection apparatus is illustrated in FIG. 2. A source model 31 represents optical characteristics (including light intensity distribution and/or phase distribution) of the source. A projection optics model 32 represents optical characteristics (including changes to the light intensity distribution and/or the phase distribution caused by the projection optics) of the projection optics. A design layout model 35 represents optical characteristics (including changes to the light intensity distribution and/or the phase distribution caused by a given design layout 33) of a design layout, which is the representation of an arrangement of features on a mask. An aerial image 36 can be simulated from the design layout model 35, the projection optics model 32 and the design layout model 35. A resist image 38 can be simulated from the aerial image 36 using a resist model 37. Simulation of lithography can, for example, predict contours and CDs in the resist image.

More specifically, it is noted that the source model 31 can represent the optical characteristics of the source that include, but not limited to, NA-sigma ($\sigma$) settings as well as any particular illumination source shape (e.g. off-axis light sources such as annular, quadrupole, and dipole, etc.). The projection optics model 32 can represent the optical characteristics of the of the projection optics that include aberration, distortion, refractive indexes, physical sizes, physical dimensions, etc. The design layout model 35 can also represent physical properties of a physical mask, as described, for example, in U.S. Pat. No. 7,587,704, which is incorporated by reference in its entirety. The objective of the simulation is to accurately predict, for example, edge placements and CDs, which can then be compared against an intended design. The intended design is generally defined as a pre-OPC design layout which can be provided in a standardized digital file format such as GDSII or OASIS or other file format.

When the resist is exposed by the projected image and thereafter baked and developed, the resist tends to undergo complex chemical and physical changes. The final resist patterns are typically characterized by their critical dimensions, or CD, usually defined as the width of a resist feature at the resist-substrate interface. While the CD is usually intended to represent the smallest feature being patterned in the given device, in practice the term CD is used to describe the linewidth of any resist feature.

In most exposure tools, the optical system reduces the size of the pattern from the mask level to the wafer level by a reduction factor, typically 4 or 5. Because of this the pattern at the mask level is typically larger than the desired pattern at the wafer level, which relaxes the dimensional control tolerances required at the mask level and improves the yield and manufacturability of the mask-making process. This reduction factor of the exposure tool introduces certain confusion in referring to "the dimension" of the exposure process. Herein, features sizes and dimensions refer to wafer-level feature sizes and dimensions, and the "minimum feature size" refers to a minimum feature at the wafer level.

For an exposure process to pattern a device correctly, the CDs of all critical structures in the device must be patterned to achieve the design target dimensions. Since it is practically impossible to achieve every target CD with no errors, the device is designed with a certain tolerance for CD errors. In this case, the pattern is considered to be acceptable if the CDs of all critical features are within these predefined tolerances. For the exposure process to be viable in a manufacturing environment, the full CD distribution must fall within the tolerance limits across a range of process conditions that represents the typical range of process variations expected to occur in the fab. For example, the actual doses of nominally identical process conditions can vary up to ±5% from the nominal dose; the actual focal planes of nominally identical process conditions can vary up to ±100 nm from the nominal focal plane.

Factors that limit or degrade the fidelity of the pattern transfer process include imperfections in the mask-making process, in the projection optics, in the resist process, and in the control of the interaction between the projected light and the film stacks formed on the wafer. However, even with a perfect mask, perfect optics, a perfect resist system, and perfect substrate reflectivity control, image fidelity becomes difficult to maintain as the dimensions of the features being imaged become smaller than the wavelength of light used in the exposure tool. For exposure processes using 193 nm illumination sources, features as small as 65 nm are desired. In this deep sub-wavelength regime, the pattern transfer process becomes highly non-linear, and the dimensions of the final pattern at the wafer level become a very sensitive function not only of the size of the pattern at the mask level, but also of the local environment of the feature, where the local environment extends out to a radius of roughly five to ten times the wavelength of light. Given the very small feature sizes compared to the wavelength, even identical structures on the mask will have different wafer-level dimensions depending on the sizes and proximities of neighboring features, and even features that are not immediately adjacent but still within the proximity region defined by the optics of the exposure tool.

In an effort to improve imaging quality and minimize high non-linearity in the pattern transfer process, current processing techniques employ various RET and OPC, a general term for any technology aimed at overcoming proximity effects. One of the simplest forms of OPC is selective bias. Given a CD vs. pitch curve, all of the different pitches could be forced to produce the same CD, at least at best focus and exposure, by changing the CD at the mask level. Thus, if a feature prints too small at the wafer level, the mask level feature would be biased to be slightly larger than nominal, and vice versa. Since the pattern transfer process from mask level to wafer level is non-linear, the amount of bias is not simply the measured CD error at best focus and exposure times the reduction ratio, but with modeling and experimentation an appropriate bias can be determined. Selective bias is an incomplete solution to the problem of proximity effects, particularly if it is only applied at the nominal process condition. Even though such bias could, in principle, be applied to give uniform CD vs. pitch curves at best focus and exposure, once the exposure process varies from the nominal condition, each biased pitch curve will respond differently, resulting in different process windows for the different features. Therefore, the "best" bias to give identical CD vs. pitch may even have a negative impact on the overall process window, reducing rather than enlarging the focus and exposure range within which all of the target features print on the wafer within the desired process tolerance.

Other more complex OPC techniques have been developed for application beyond the one-dimensional bias example above. A two-dimensional proximity effect is line end shortening. Line ends have a tendency to "pull back" from their desired end point location as a function of exposure and focus. In many cases, the degree of end shortening of a long line end can be several times larger than the corresponding line narrowing. This type of line end pull back can result in catastrophic failure of the devices being manufactured if the line end fails to completely cross over the underlying layer it was intended to cover, such as a polysilicon gate layer over a source-drain region. Since this type of pattern is highly sensitive to focus and exposure, simply biasing the line end to be longer than the design length is inadequate because the line at best focus and exposure, or in an underexposed condition, would be excessively long, resulting either in short circuits as the extended line end touches neighboring structures, or unnecessarily large circuit sizes if more space is added between individual features in the circuit. Since one of the key goals of integrated circuit design and manufacturing is to maximize the number of functional elements while minimizing the area required per chip, adding excess spacing is a highly undesirable solution.

Two-dimensional OPC approaches have been developed to help solve the line end pull back problem. Extra structures (or assist features) known as "hammerheads" or "serifs" are routinely added to line ends to effectively anchor them in place and provide reduced pull back over the entire process window. Even at best focus and exposure these extra structures are not resolved but they alter the appearance of the main feature without being fully resolved on their own. A "main feature" as used herein means a feature intended to print on a wafer under some or all conditions in the process window. Assist features can take on much more aggressive forms than simple hammerheads added to line ends, to the extent the pattern on the mask is no longer simply the desired wafer pattern upsized by the reduction ratio. Assist features such as serifs can be applied to many more cases than simply reducing line end pull back. Inner or outer serifs can be applied to any edge, especially two dimensional edges, to reduce corner rounding or edge extrusions. With enough selective biasing and assist features of all sizes and polarities, the features on the mask bear less and less of a resemblance to the final pattern desired at the wafer level. In general, the mask pattern becomes a pre-distorted version of the wafer-level pattern, where the distortion is intended to counteract or reverse the pattern deformation that will occur during the lithographic process to produce a pattern on the wafer that is as close to the one intended by the designer as possible.

Many of these OPC techniques can be used together on a single mask with phase-shifting structures of different phases added in as well for both resolution and process window enhancement. The simple task of biasing a one-dimensional line becomes increasingly complicated as two-dimensional structures must be moved, resized, enhanced with assist features, and possibly phase-shifted without causing any conflict with adjoining features. Due to the extended proximity range of deep sub-wavelength lithography, changes in the type of OPC applied to a feature can have unintended consequences for another feature located within half a micron to a micron. Since there are likely to be many features within this proximity range, the task of optimizing OPC decoration becomes increasingly complex with the addition of more aggressive approaches. Each new feature that is added has an effect on other features, which then can be re-corrected in turn, and the results can be iterated repeatedly to converge to a mask layout where each feature can be printed in the manner in which it was originally intended while at the same time contributing in the proper manner to the aerial images of its neighboring features such that they too are printed within their respective tolerances.

SUMMARY

Described herein is a method for simulating an image formed within a resist layer on a substrate resulting from an incident radiation, the substrate having a first feature and a second feature underlying the resist layer, the method comprising: simulating a first partial image within the resist layer using interaction of the incident radiation and the first feature without using interaction of the incident radiation and the second feature; simulating a second partial image within the resist layer using the interaction of the incident radiation and of the second feature without using the interaction of the incident radiation and the first feature; computing the image formed within the resist layer from the first partial image, and the second partial image; wherein the interaction of the incident radiation and the first feature is different from the interaction of the incident radiation and the second feature.

DETAILED DESCRIPTION

Figure 1:
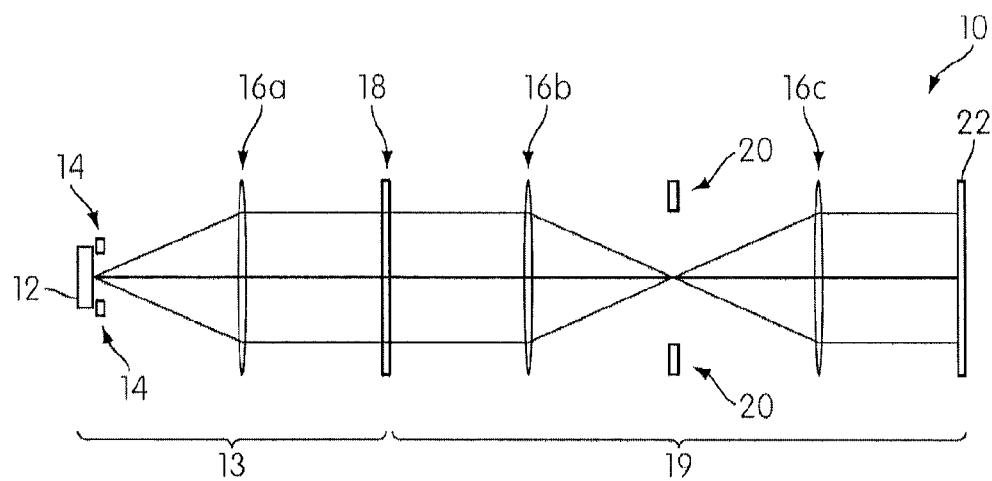
FIG. 1 is a block diagram of various subsystems of a lithography system.

Embodiments will now be described in detail with reference to the drawings, which are provided as illustrative examples. Notably, the figures and examples below are not meant to limit the scope to a single embodiment, but other embodiments are possible by way of interchange of some or all of the described or illustrated elements. Moreover, where certain elements described herein can be partially or fully implemented using known components, only those portions of such known components that are necessary for an understanding of the description herein will be described, and detailed descriptions of other portions of such known components will be omitted without obscuration. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the scope is intended to encompass other embodiments including a plurality of the same component, and vice-versa, unless explicitly stated otherwise herein. Moreover, any term in the specification or claims is not intended to be ascribed an uncommon or special meaning unless explicitly set forth as such.

The pattern transfer process from the mask to the substrate during a lithographic process is affected by scattering of incident radiation from the projection optics by features on the substrate under a resist layer, especially when the features are smaller than the wavelength of the incident radiation or when the substrate lacks an anti-reflective coating (BARC).

The term "incident radiation" as used herein means radiation incident on the substrate. The incident radiation can have any intensity, spatial and phase profile. For example, the incident radiation may be radiation from a light source shaped by source shaping optics, a mask and projection optics. The incident radiation may be experimentally measured or simulated by any suitable modeling methods from characteristics of the various components of a lithographic projection apparatus. The term "scatter" or "scattering" as used herein means a combination of effects to incident radiation, which can include reflection, diffraction, and refraction. Scattered radiation can interfere with incident radiation and change spatial intensity distribution of radiation in the resist layer, which in turn changes a resist image formed therein. This scattering can cause distortion to the resultant resist image and therefore should also be compensated for in OPC. The effect of this scattering can be further complicated if multiple features with different interactions with incident radiation are on the substrate. In one embodiment, the different interactions with the incident radiation may be due to difference in the filmstacks in the features; in one embodiment, the different interactions may be due to difference in the height of the features. The term "feature" should be broadly interpreted as a discrete or continuous area on the substrate. The word "discrete" as used herein means a feature (e.g., Feature 301 or Feature 302 in FIG. 3) that has two or more unconnected portions. For example, as illustrated on FIG. 3, two different materials, Material 310 and Material 320, are on the substrate 350 under a resist 340. Material 310 and Material 320 partially overlap. From the viewpoint of OPC, three features (labeled as Feature 301, Feature 302 and Feature 303 in FIG. 3) may be identified in this example. Feature 301 is the discrete areas where only Material 310 coats the substrate 350; Feature 302 is the discrete areas where Material 310 and Material 320 overlap and both coat the substrate 350; Feature 303 is the continuous area where only Material 320 coats the substrate 350. Because of the different material stacks, Feature 301, Feature 302 and Feature 303 interact with the incident radiation differently. Other examples of features include STI (shallow trench isolation), source/drain (usually heavily doped silicon). STI is an integrated circuit feature which prevents electrical current leakage between adjacent semiconductor device components. STI is generally used on CMOS process technology nodes of 250 nanometers and smaller. STI may be formed by etching a pattern of trenches in the substrate, depositing one or more dielectric materials (such as silicon dioxide) to fill the trenches, and removing the excess dielectric using a technique such as chemical-mechanical planarization. Source and drain of transistors may be made by techniques such as ion implantation and dopant diffusion.

The effect of scattering by features on the substrate can be rigorously predicted by solving Maxwell's equations, which however is computationally costly and impractical to apply to a full substrate or a full mask. Conventional approaches reduce computational cost by ignoring interference among scattered radiation and incident radiation fail to predict the effect of scattering accurately.

According to some aspects, a simulated image in a resist layer is computed while accounting for scattered radiation due to features on the substrate. In some embodiments, the spatial intensity of distribution of radiation in the resist layer can be derived using an example method depicted in the flow chart of FIG. 4.

In step 401, various features in or underlying a resist layer on a substrate may be identified. Features can be identified, e.g., from a mask pattern or imaging of the substrate. The mask pattern used to identify the features is a pattern in a mask that was used to print these features on the substrate. For example, Features 301, 302 and 303 may be identified from the substrate in FIG. 3. In an embodiment, materials stack on the substrate is the same throughout a feature. In another embodiment, a feature may include different materials stacks on the substrate within the boundary of the feature.

Figure 3:
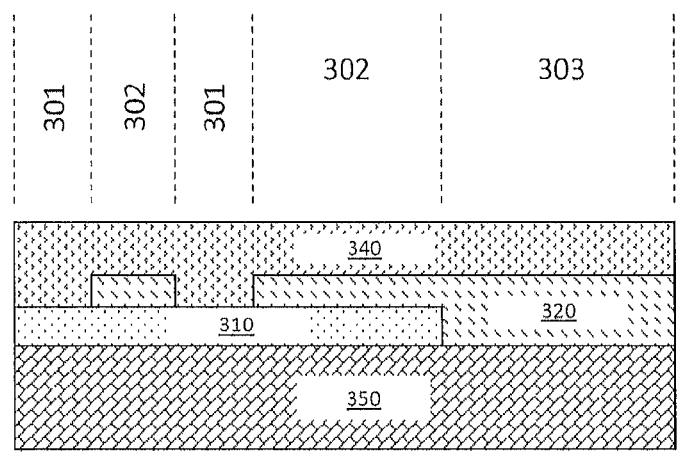
FIG. 3 shows an example of features on a substrate.
Figure 5:
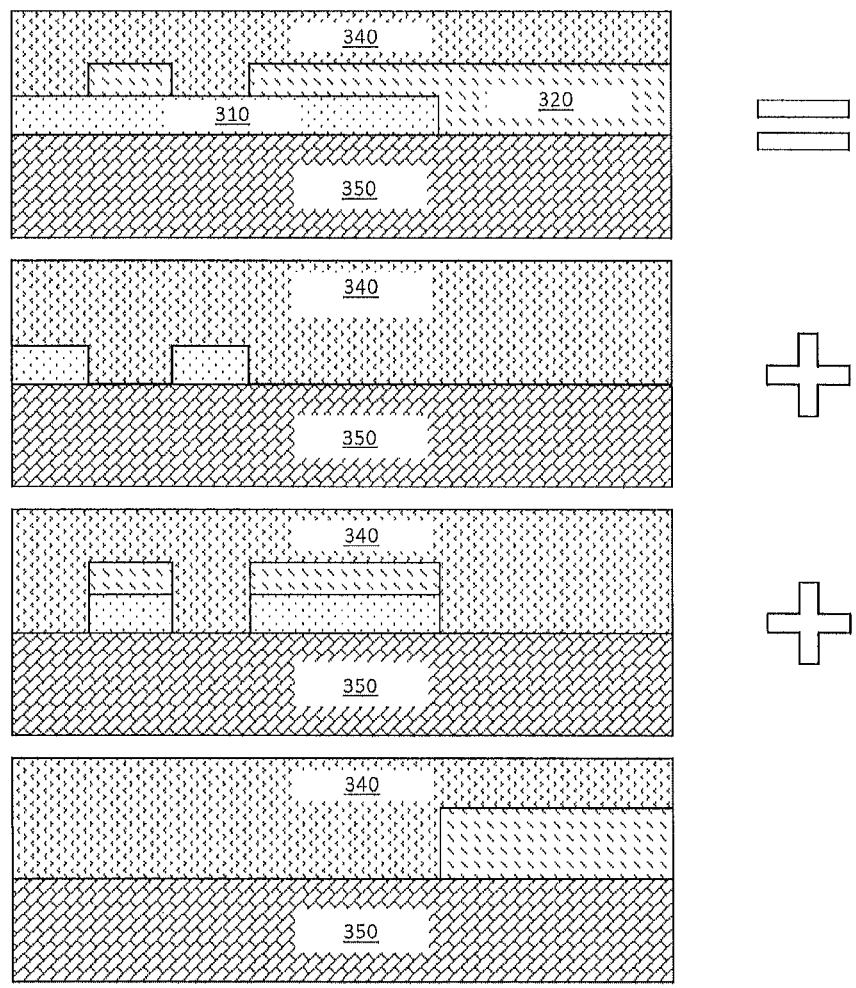
FIG. 5 shows exemplary substrates derived from the example of FIG. 3.

In step 402, a partial image within the resist is simulated for each of the identified features using interaction of incident radiation and that feature without using interaction of the incident radiation and the other identified features. The partial image simulated for one identified feature is not spatially confined within the boundary of that identified feature, but may extend beyond the boundary of that identified feature. The term "partial image" as used herein means a spatial intensity distribution of radiation in the resist layer, calculated using any suitable method using interaction of incident radiation and that feature without using interaction of the incident radiation and the other identified features. For example, a partial image may be calculated from a substrate with only one of the identified features and without any of the other identified features. Using the example of FIG. 3, FIG. 5 illustrates substrates having only Feature 301, Feature 302 and Feature 303, respectively. The partial images may be calculated using any suitable method. In one embodiment, a radiation profile at the exposed surface of the resist layer as if there were no scattering from the feature, may be calculated using any suitable method known to a skilled artisan. This radiation profile is independent from the feature and thus may be reused in calculation of every partial image. Scattering of the radiation profile by the feature may then be calculated and combined with the radiation profile to arrive at the partial image.

Figure 2:
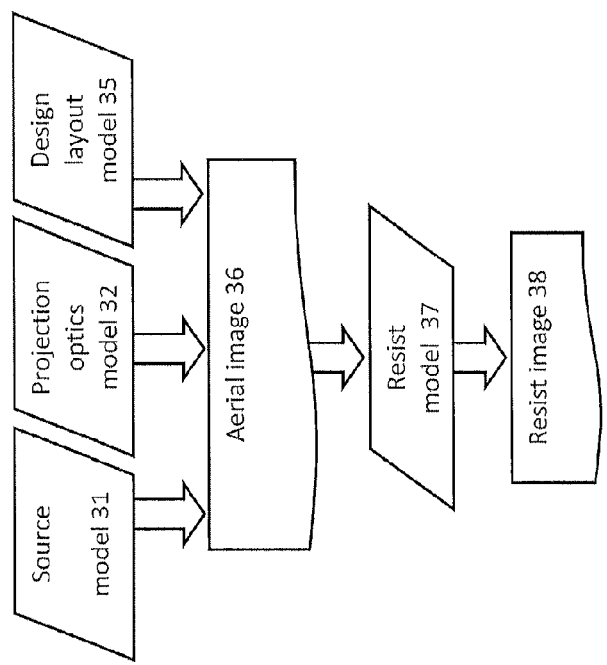
FIG. 2 is a block diagram of simulation models corresponding to the subsystems in FIG. 1.

In one embodiment, the partial images may be calculated using the simulation scheme depicted in FIG. 2, with the interaction between the incident radiation and the feature incorporated in the projection optics model 32. Namely, the feature may be considered part of the projection optics and the interaction between the incident radiation and the feature may thus be incorporated into the projection optics model 32. For example, the combined optical behaviors of the source and the projection optics of a lithographic projection apparatus can be represented by the transmission cross coefficient (TCC). An aerial image AI can be expressed as $$AI(x) = \Sigma_k |A(k)\Sigma_{k'} M(k'-k)L(k')\exp(-jk'x)|^2 \quad \text{(Eq. 1)}$$
$$= \Sigma_k A(k)^2 [\Sigma_{k'}\Sigma_{k''} M(k'-k)L(k')M^*(k''-k)L^*(k'')\exp(-j(k'-k'')x)]$$
$$= \Sigma_{k'}\Sigma_{k''} [\Sigma_k A(k)^2 L(k+k')L^*(k+k'')]M(k')M^*(k'')\exp(-j(k'-k'')x)$$
$$= \Sigma_{k'}\Sigma_{k''} TCC_{k',k''} M(k')M^*(k'')\exp(-j(k'-k'')x)$$

wherein $TCC_{k',k''} \equiv \Sigma_k A(k)^2 L(k+k')L^*(k+k'')$ (Eq. 2)

AI(x) is the aerial image in the space domain. A(k) is an amplitude function in the spatial frequency domain of the source, and can be obtained from the amplitude in the space domain of the source by a Fourier transform. L(k) is the projection optics function in the spatial frequency domain, and can be obtained from the projection optics function in the space domain of the projection optics by a Fourier transform. The projection optics function in the space domain represents distortions caused by the projection optics to the light passing through the projection optics (e.g., distortions in amplitude, phase or both) as a function of location. Here, if the scattering of the feature is incorporated in the projection optics model 32, L(k) would also represent distortions and scattering of the light from the source. M(k) is the mask function (i.e., design layout function) in the spatial frequency domain, and can be obtained from the mask function in the space domain by a Fourier transform. The mask function in the space domain represents distortions caused by the mask to the light passing through the mask (e.g., distortions in amplitude, phase or both) as a function of location. More details can be found in, for example, in U.S. Pat. No. 7,587,704, which is incorporated by reference in its entirety. A function in the space domain can be transformed to a corresponding function in the spatial frequency domain and vice versa by Fourier transform. Here, x and k are both vectors. $TCC_{k',k''}$, as defined in Eq. 2, is a tensor, which only includes optical properties of the lithographic projection apparatus excluding the mask. An aerial image (AI) is the light intensity distribution on the substrate. A resist layer on the substrate is exposed and the aerial image is transferred to the resist layer as a latent "resist image" (RI) therein. The resist image (RI) can be defined as a spatial distribution of solubility of the resist in the resist layer, A resist model can be used to calculate the resist image from the aerial image, an example of which can be found in U.S. Pat. No. 8,200,468, disclosure of which is hereby incorporated by reference in its entirety. The resist model is related only to properties of the resist layer (e.g., effects of chemical processes which occur during exposure, PEB and development). More details of TCC may be found in commonly assigned U.S. Patent Application Ser. No. 61/414,787, disclosure of which is hereby incorporated by reference in its entirety.

In one embodiment, the partial image of Feature 301, $PI_1$ and the partial image of Feature 302, $PI_2$, may be calculated as follows:

$$PI_1(x) = \Sigma_{k'}\Sigma_{k''} TCC_{k',k'',1} M_1(k')M_1^*(k'')\exp(-j(k'-k'')x),$$

$$PI_2(x) = \Sigma_{k'}\Sigma_{k''} TCC_{k',k'',2} M_2(k')M_2^*(k'')\exp(-j(k'-k'')x),$$

wherein $M_1$ is the mask function of Feature 301 alone without any other feature, $M_2$ is the mask function of Feature 302 alone without any other feature, $TCC_{k',k'',1}$ is a TCC as if the filmstack of Feature 1 covers the entire substrate, and $TCC_{k',k'',2}$ is a TCC as if the filmstack of Feature 302 covers the entire substrate.

In step 403, the partial images and their interferences are then combined to arrive at an image PI (i.e., the spatial intensity of distribution of radiation the spatial intensity of distribution of radiation) within the resist layer. For example, the partial image of Feature 301, $PI_1$ and the partial image of Feature 302, $PI_2$, can be combined by the equation:

$$PI = PI_1 + PI_2 + 2\sqrt{PI_1 \times PI_2} \cos\theta \quad \text{(Eq. 3)},$$

wherein the third term is the interference of $PI_1$ and $PI_2$, θ is a phase difference between $PI_1$ and $PI_2$, θ is a function of location. θ may approximated by an average phase difference between $PI_1$ and $PI_2$, assuming the incident radiation a planar wave, or by a phase difference between $PI_1$ and $PI_2$ at a give location, θ can be derived from the characteristics of Feature 301 and Feature 302 such as their refraction indexes and their thicknesses. Of course, this method is not limited to two features but is applicable to any number of features. This method is much less computationally costly and can be applied to the full substrate or the full mask. The interference may be calculated using a rigorous model, by analyzing measured CD data. The interference between partial images of a pair of features may be calculated and organized in a library, so that a spatial intensity of distribution of radiation the spatial intensity of distribution of radiation may be calculated using Eq. 3 by retrieving the interference from the library without calculating the interference again. The library may include indices.

Figure 6:
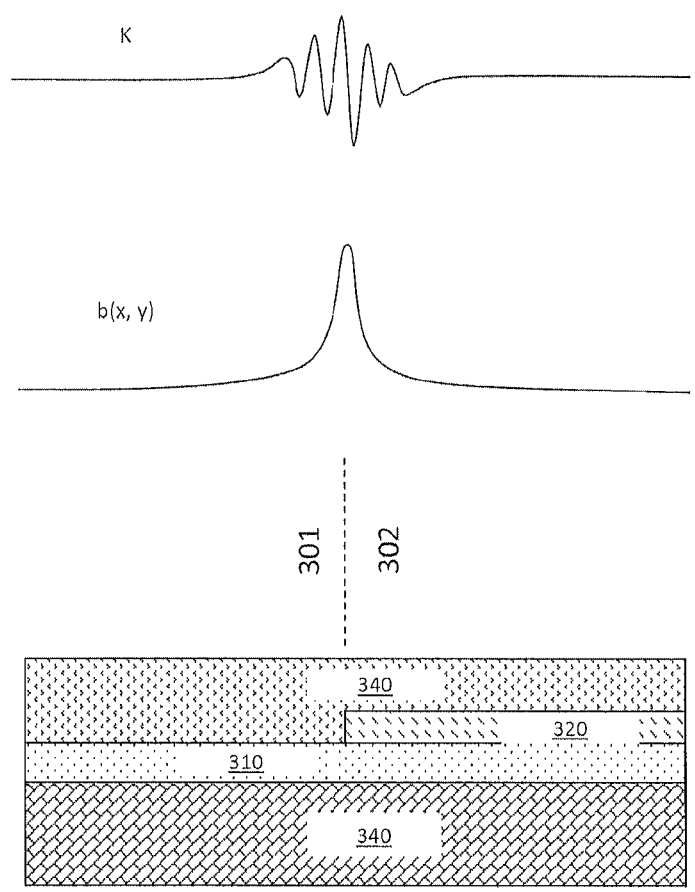
FIG. 6 shows an example in which ripples near a boundary of two features are calculated.

In another embodiment, the interference can further comprise interference ripples of the partial images near the boundaries between the features. For example, a kernel function may be defined such that the kernel function has ripples near the boundaries between the features and is zero elsewhere. In another example, a kernel function may have ripples at every location. FIG. 6 shows an exemplary kernel function K (upper panel). The kernel function may be empirically defined, constructed from rigorous simulation results, or from experimental data. The kernel function may depend on characteristics of the features, such as the sidewall angle, transmittance, refractive index, etc. A set of kernel functions may be predefined and stored in a library wherein each of the kernel functions in the library is for a boundary between two features of a specific pair of materials stacks. An exemplary kernel function may be a cosine function enveloped by a Gaussian function:

$$\cos(kx - \theta_0) \cdot e^{-\frac{(x-x_0)^2}{2\sigma^2}},$$

where x is the distance to the boundary between two features, all the other variables are fitting parameters. In an embodiment, the image PI can be derived from the equation:

$$PI = PI_1 + PI_2 (2\sqrt{PI_1 \times PI_2} \cos \theta + b(x,y) \otimes K) \quad (Eq. 4),$$

wherein b(x, y) is a function of non-zero values only in the proximity of boundaries of the features (as shown in the example in FIG. 6), K is the kernel function, and $\otimes$ means convolution. θ may approximated by any method explained above, such as an average phase difference between $PI_1$ and $PI_2$.

The interference $(2\sqrt{PI_1 \times PI_2} \cos \theta + b(x, y) \otimes K)$ comprises interference ripples $b(x, y) \otimes K$ in the proximity of boundaries of the features.

Figure 4:
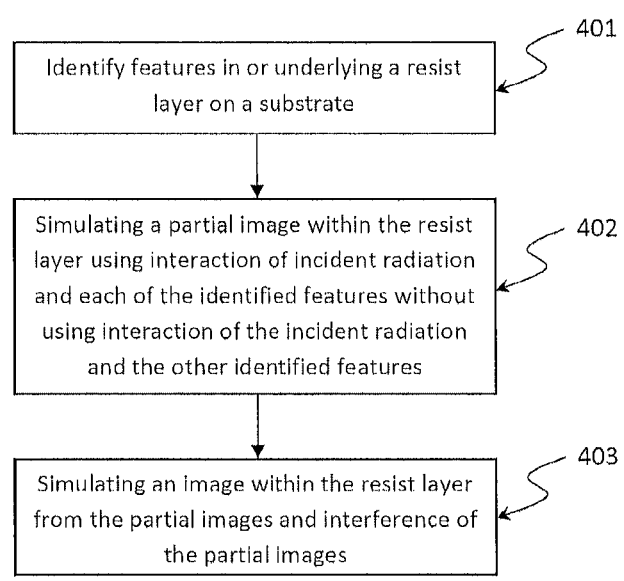
FIG. 4 shows a flow chart of a method according to an embodiment.

The method illustrated in FIG. 4 is not limited to only two features. For example, image PI can be a sum of a plurality of partial images of a plurality of features, and interference between each pair of the partial images:

$$PI = \sum_{i=1}^{n} PI_i + \frac{1}{2} \sum_{i,j=1; i \neq j}^{n} \text{Interference}(PI_i, PI_j).$$

The resist image can be estimated from the spatial intensity distribution by applying a blur such as Gaussian blur and applying a threshold. Of course, the resist image can be estimated using any other suitable methods. This estimation process (e.g., parameters in the Gaussian blur) depends on characteristics of the resist and any post-exposure processing such as developing and baking.

Figure 7:
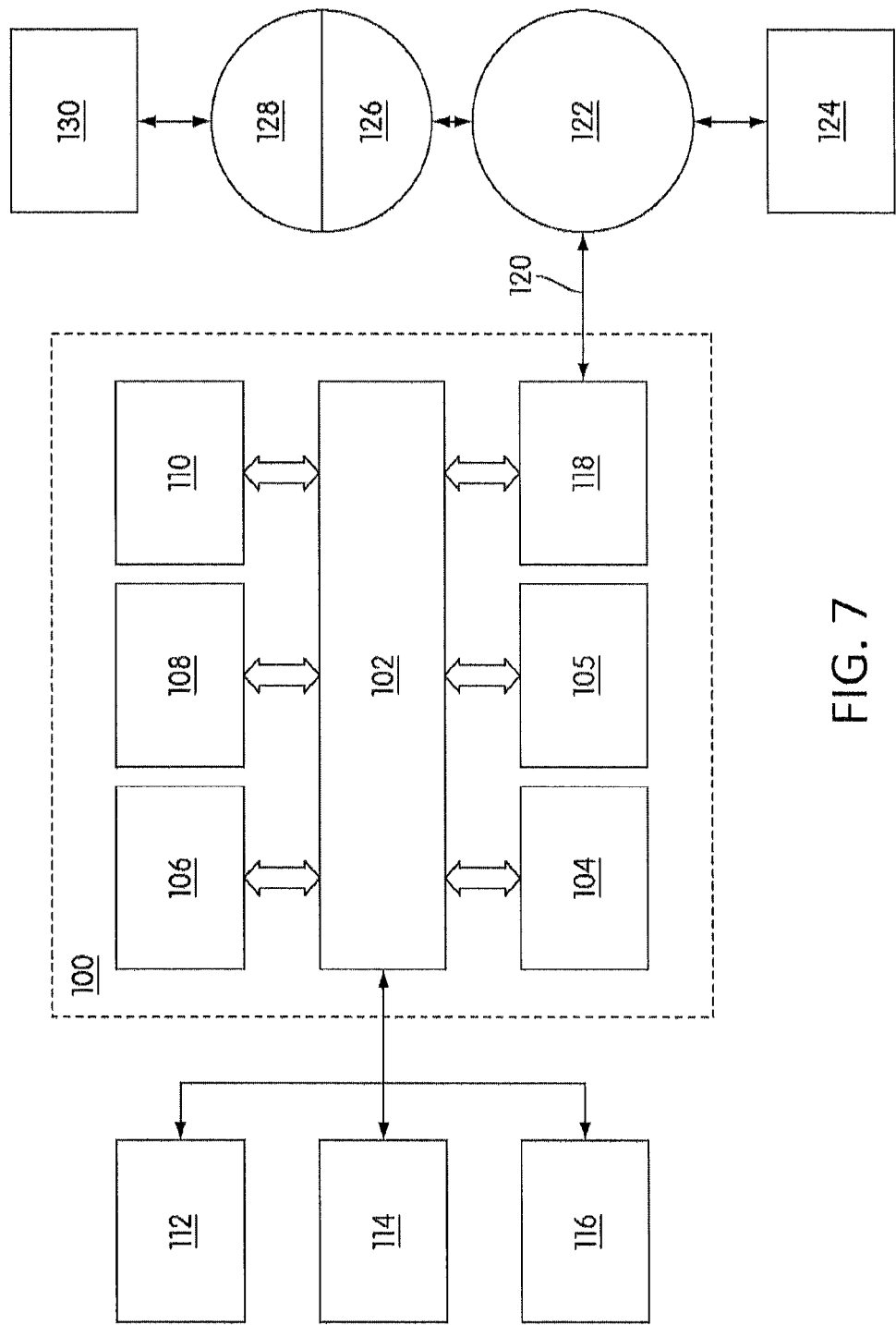
FIG. 7 is a block diagram of an example computer system in which embodiments can be implemented.

FIG. 7 is an exemplary block diagram that illustrates a computer system 100 which can assist in embodying and/or implementing the pattern selection method disclosed herein. Computer system 100 includes a bus 102 or other communication mechanism for communicating information, and one or more processor(s) 104 (and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the simulation process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions. Thus, embodiments are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions.

The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126, ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with an embodiment, one such downloaded application provides for the test pattern selection of the embodiment, for example. The received code may be executed by processor 104 as it is received, and/or stored in storage device 110, or other non-volatile storage for later execution. In this manner, computer system 100 may obtain application code in the form of a carrier wave.

Figure 8:
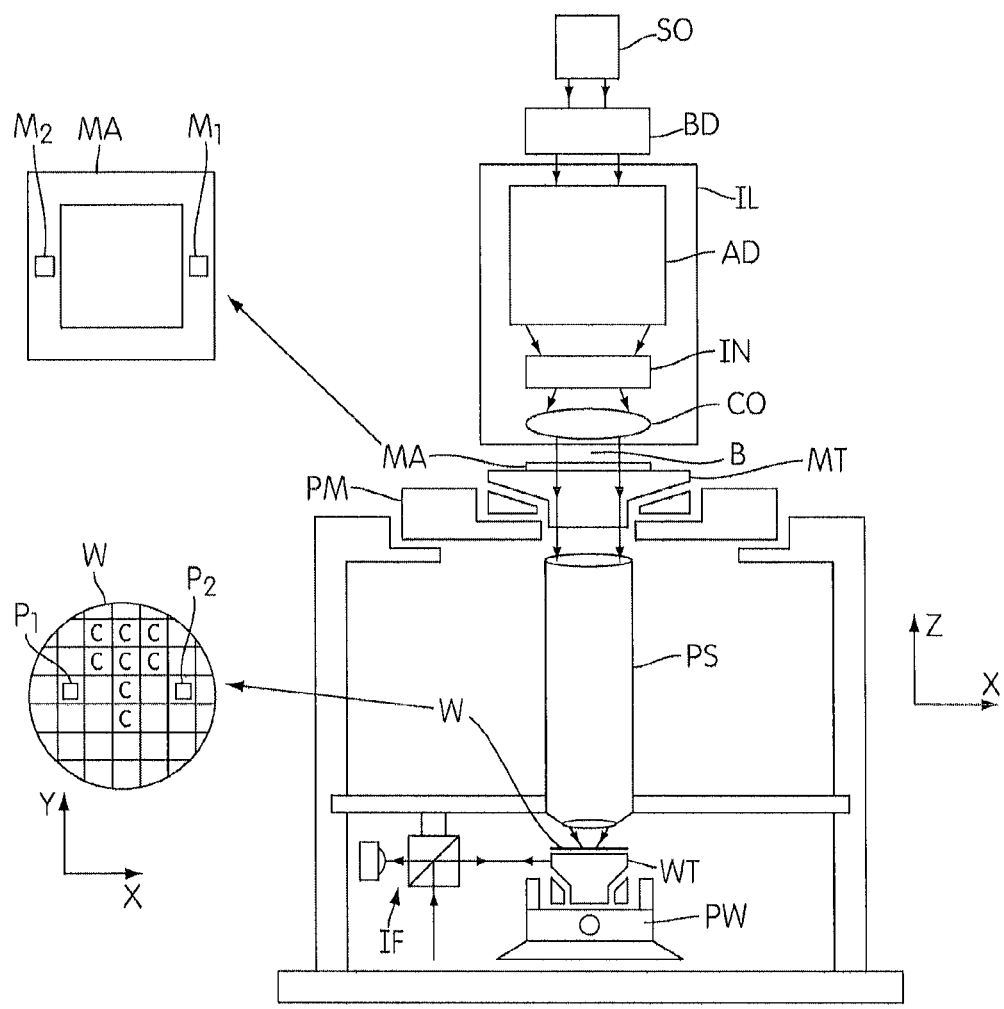
FIG. 8 is a schematic diagram of a lithographic projection apparatus to which embodiments are applicable.

FIG. 8 schematically depicts an exemplary lithographic projection apparatus whose performance could be simulated and/or optimized utilizing the methods described herein. The apparatus comprises:

- a radiation system IL, for supplying a projection beam B of radiation. In this particular case, the radiation system also comprises a radiation source SO;
- a first object table (mask table) MT provided with a mask holder for holding a mask MA (e.g., a reticle), and connected to first positioning means PM for accurately positioning the mask with respect to projection system PS;
- a second object table (substrate table) WT provided with a substrate holder for holding a substrate W (e.g., a resist coated silicon wafer), and connected to second positioning means PW for accurately positioning the substrate with respect to projection system PS;
- a projection system ("lens") PS (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source SO (e.g., a mercury lamp or excimer laser) produces a beam of radiation. This beam is fed into an illumination system (illuminator) IL, either directly or after having traversed conditioning means, such as a beam expander or beam delivery system BD, for example. The illuminator IL may comprise adjusting means AD for setting the outer and/or inner radial extent (commonly referred to as sigma-outer and sigma-inner, respectively) of the intensity distribution in the beam. In addition, it will generally comprise various other components, such as an integrator IN and a condenser CO. In this way, the beam B impinging on the mask MA has a desired uniformity and intensity distribution in its cross section.

It should be noted with regard to FIG. 8 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or F2 lasing). The current invention encompasses at least both of these scenarios.

The beam B subsequently intercepts the mask MA, which is held on a mask table MT. Having traversed the mask MA, the beam B passes through the lens PS, which focuses the beam PS onto a target portion C of the substrate W. With the aid of the second positioning means (and interferometric measuring means IF), the substrate table WT can be moved accurately, e.g. so as to position different target portions C in the path of the beam B. Similarly, the first positioning means can be used to accurately position the mask MA with respect to the path of the beam B, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 8. However, in the case of a wafer stepper (as opposed to a step-and-scan tool) the mask table MT may just be connected to a short stroke actuator, or may be fixed. Patterning device MA and substrate W may be aligned using alignment marks M1, M2 in the patterning device, and alignment marks P1, P2 on the wafer, as required.

The depicted tool can be used in two different modes:
- In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam B;
- In scan mode, essentially the same scenario applies, except that a given target portion C is not exposed in a single "flash". Instead, the mask table MT is movable in a given direction (the so called "scan direction", e.g., the y direction) with a speed v, so that the projection beam B is caused to scan over a mask image; concurrently, the substrate table WT is simultaneously moved in the same or opposite direction at a speed V=Mv, in which M is the magnification of the lens PS (typically, M=¼ or ⅕). In this manner, a relatively large target portion C can be exposed, without having to compromise on resolution.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include DUV (deep ultra violet) lithography that is capable of producing a 193 nm wavelength with the use of a ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

It should be readily apparent to those of ordinary skill in the art that changes and modifications in the form and details may be made without departing from the spirit and scope. It is intended that the appended claims encompass such changes and modification. The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The invention may further be described using the following clauses:

1. A method for simulating an image formed within a resist layer on a substrate resulting from an incident radiation, the substrate having a first feature and a second feature underlying the resist layer, the method comprising:
simulating a first partial image within the resist layer using interaction of the incident radiation and the first feature without using interaction of the incident radiation and the second feature;
simulating a second partial image within the resist layer using the interaction of the incident radiation and of the second feature without using the interaction of the incident radiation and the first feature;
computing the image formed within the resist layer from the first partial image, and the second partial image;
wherein the interaction of the incident radiation and the first feature is different from the interaction of the incident radiation and the second feature.

2. The method of clause 1, wherein computing the image further comprises computing the image from the first partial image, the second partial image and an interference.
3. The method of clause 2, wherein the interference comprises interference of the first partial image and the second partial image
4. The method of clause 2, where the interference comprises interference ripples of the first partial image and the second partial image near the boundaries of the first feature and the second feature.
5. The method of any one of clauses 1-4, wherein the interaction of the incident radiation and the first feature is scattering of the incident radiation by the first feature; or wherein the interaction of the incident radiation and the second feature is scattering of the incident radiation by the second feature.
6. The method of any one of clauses 1-4, wherein the first feature is discrete or wherein the second feature is discrete.
7. The method of any one of clauses 2-4, wherein the interference is calculated using a rigorous model or by analyzing measured CD data.
8. The method of any one of clauses 1-4, wherein a material stack on the substrate is the same throughout the first feature or a material stack on the substrate is the same throughout the second feature.
9. The method of any one of clauses 1-4, wherein the first partial image is simulated from a substrate with only the first feature without the second feature, and the second partial image is simulated from a substrate with only the second feature without the first feature.
10. The method of any one of clauses 2-3, wherein the interference of the first partial image and the second partial image is calculated using a phase difference between the first partial image and the second partial image.
11. The method of clause 10, wherein the phase difference between the first partial image and the second partial image is an average phase difference between the first partial image and the second partial image.
12. The method of clause 4, wherein the interference ripples are calculated from a kernel function.
13. The method of clause 12, wherein the kernel function is empirically defined, constructed from rigorous simulation, or constructed from experimental data.
14. The method of clause 12, wherein the kernel function depends on characteristics of the first feature and the second feature.
15. The method of clause 14, wherein the characteristics comprise sidewall angle, transmittance, refractive index, or a combination thereof.
16. The method of clause 12, wherein the kernel function is selected from a set of kernel functions, each of the set of kernel functions is for a boundary between two features of a specific pair of materials stacks.
17. The method of any one of clauses 1-16, wherein the incident radiation has a wavelength in the extreme ultraviolet band.
18. The method of any one of clauses 1-17, wherein the substrate is free of an anti-reflective coating.
19. The method of any one of clauses 1-18, wherein at least one of the first and second features has a dimension smaller than a wavelength of the incident radiation.
20. The method of any one of clauses 1-19, wherein the first feature and the second feature have different height.
21. The method of clause 12, wherein the kernel function is predefined and stored in a library wherein each of kernel functions in the library is for a boundary between two features of a specific pair of materials stacks.
22. The method of any one of clauses 1-4, wherein the first partial image is simulated from a first mask function of the first feature alone without any other feature, and a transmission cross coefficient as if a filmstack of the first feature covers the entire substrate; the second partial image is simulated from a second mask function of the second feature alone without any other feature, and a transmission cross coefficient as if a filmstack of the second feature covers the entire substrate.

23. A computer program product comprising a computer readable medium having instructions recorded thereon, the instructions when executed by a computer implementing the method of any of the above claims.

The descriptions above are intended to be illustrative, not limiting. Thus, it will be apparent to one skilled in the art that modifications may be made to the embodiments as described without departing from the scope of the claims set out below.

What is claimed is:

1. A method implemented by a computer for simulating an image formed within a resist layer on a substrate resulting from an incident radiation, the substrate having a first feature and a second feature underlying the resist layer that are simultaneously subjected to the incident radiation, the method comprising:

simulating, using the computer, a first partial image within the resist layer that represents interaction of the incident radiation with the first feature exclusive of any interaction of the incident radiation with the second feature;

simulating, using the computer, a second partial image within the resist layer that represents interaction of the incident radiation with the second feature exclusive of any interaction of the incident radiation with the first feature; and computing the image formed within the resist layer from the first partial image, and the second partial image;

wherein the interaction of the incident radiation with the first feature is different from the interaction of the incident radiation with the second feature.

2. The method of claim 1, wherein computing the image further comprises computing the image from the first partial image, the second partial image and an interference due to the simultaneous interactions of the incident radiation with the first and second features.

3. The method of claim 2, further comprising computing the interference using the first partial image and the second partial image.

4. The method of claim 2, where the interference comprises interference ripples of the first partial image and the second partial image near the boundaries of the first feature and the second feature.

5. The method of claim 4, wherein the interference ripples are calculated from a kernel function.

6. The method of claim 5, wherein the kernel function is empirically defined, constructed from rigorous simulation, or constructed from experimental data.

7. The method of claim 5, wherein the kernel function depends on characteristics of the first feature and the second feature, and wherein the characteristics comprise sidewall angle, transmittance, refractive index, or a combination thereof.

8. The method of claim 5, wherein the kernel function is selected from a set of kernel functions, each of the set of kernel functions is for a boundary between two features of a specific pair of materials stacks.

9. The method of claim 5, wherein the kernel function is predefined and stored in a library wherein each of kernel functions in the library is for a boundary between two features of a specific pair of materials stacks.

10. The method of claim 2, further comprising calculating the interference using a rigorous model or by analyzing measured CD data.

11. The method of claim 2, further comprising calculating the interference using a phase difference between the first partial image and the second partial image.

12. The method of claim 11, wherein the phase difference between the first partial image and the second partial image is an average phase difference between the first partial image and the second partial image.

13. The method of claim 1, wherein the interaction of the incident radiation and the first feature is scattering of the incident radiation by the first feature; or wherein the interaction of the incident radiation and the second feature is scattering of the incident radiation by the second feature.

14. The method of claim 1, wherein a material stack on the substrate is the same throughout the first feature or a material stack on the substrate is the same throughout the second feature.

15. The method of claim 1, wherein the first partial image is simulated from a substrate with only the first feature without the second feature, and the second partial image is simulated from a substrate with only the second feature without the first feature.

16. The method of claim 1, wherein the substrate is free of an anti-reflective coating.

17. The method of claim 1, wherein at least one of the first and second features has a dimension smaller than a wavelength of the incident radiation.

18. The method of claim 1, wherein a resist thickness of the first feature is different from a resist thickness of the second feature.

19. The method of claim 1, wherein the first partial image is simulated from a first mask function of the first feature alone without any other feature, and a transmission cross coefficient as if a filmstack of the first feature covers the entire substrate; the second partial image is simulated from a second mask function of the second feature alone without any other feature, and a transmission cross coefficient as if a filmstack of the second feature covers the entire substrate.

20. The method of claim 1, wherein the first partial image is not confined to the first feature.

21. The method of claim 20, wherein the second partial image is not confined to the second feature.

22. The method of claim 1, wherein the second partial image is not confined to the second feature.

23. A computer program product comprising a non-transitory computer readable medium having instructions recorded thereon, the instructions when executed by a computer implementing method for simulating an image formed within a resist layer on a substrate resulting from an incident radiation, the substrate having a first feature and a second feature underlying the resist layer that are simultaneously subjected to the incident radiation, the method comprising:

simulating a first partial image within the resist layer that represents interaction of the incident radiation with the first feature exclusive of any interaction of the incident radiation with the second feature;

simulating a second partial image within the resist layer that represents interaction of the incident radiation with the second feature exclusive of any interaction of the incident radiation with the first feature; and computing the image formed within the resist layer from the first partial image, and the second partial image;

wherein the interaction of the incident radiation with the first feature is different from the interaction of the incident radiation with the second feature.

* * * * *